(12) United States Patent
Kitajima et al.

(10) Patent No.: US 11,789,052 B2
(45) Date of Patent: Oct. 17, 2023

(54) TRANSFORMER CONNECTION PHASE DETERMINATION PROGRAM, DEVICE, AND METHOD

(71) Applicant: FUJITSU LIMITED, Kawasaki (JP)

(72) Inventors: Hironobu Kitajima, Kawasaki (JP); Tetsuya Kashiwagi, Ota (JP)

(73) Assignee: FUJITSU LIMITED, Kawasaki (JP)

( * ) Notice: Subject to any disclaimer, the term of this patent is extended or adjusted under 35 U.S.C. 154(b) by 89 days.

(21) Appl. No.: 17/388,029

(22) Filed: Jul. 29, 2021

(65) Prior Publication Data
US 2022/0043042 A1 Feb. 10, 2022

(30) Foreign Application Priority Data
Aug. 7, 2020 (JP) .................................. 2020-135230

(51) Int. Cl.
*G01R 25/00* (2006.01)
*H02J 13/00* (2006.01)

(52) U.S. Cl.
CPC ........ *G01R 25/00* (2013.01); *H02J 13/00002* (2020.01)

(58) Field of Classification Search
CPC .... G01R 25/00; G01R 29/18; H02J 13/00002
See application file for complete search history.

(56) References Cited

U.S. PATENT DOCUMENTS

| | | | |
|---|---|---|---|
| 2015/0042314 A1* | 2/2015 | Imai ....................... | G01R 11/32 324/133 |
| 2015/0134281 A1* | 5/2015 | Kitajima ................ | G01R 31/66 702/62 |
| 2015/0241490 A1* | 8/2015 | Kitajima ................ | G01R 29/18 324/76.77 |
| 2016/0091542 A1* | 3/2016 | Kitajima ................ | G01R 29/18 702/60 |
| 2019/0348216 A1* | 11/2019 | Kim ..................... | G01R 19/165 |

FOREIGN PATENT DOCUMENTS

JP 2015-94752 A 5/2015

\* cited by examiner

*Primary Examiner* — Jermele M Hollington
*Assistant Examiner* — Zannatul Ferdous
(74) *Attorney, Agent, or Firm* — XSENSUS LLP

(57) ABSTRACT

A non-transitory computer-readable medium storing a program that causes a computer to execute a process including, calculating, for each of a plurality of groups each of which is a combination of two power distribution lines selected from a plurality of power distribution lines, an index value that indicates a correlation between time-series data of a sum of line currents that flow through the two power distribution lines included in a group and time-series data of consumed power consumed by at least one consuming subject coupled to a transformer coupled to any one of phases that corresponds to combinations of two of the plurality of power distribution lines or current that corresponds to the power; and determining that a phase that corresponds to the group that corresponds to the index value indicating a highest correlation among the plurality of groups is a connection phase to which the transformer is coupled.

18 Claims, 11 Drawing Sheets

FIG. 9

| CONSUMER ID | TRANSFORMER ID | POWER DISTRIBUTION SECTION ID | DATA AVAILABILITY FLAG |
|---|---|---|---|
| d1 | T1 | I1-2 | AVAILABLE |
| d2 | T2 | I1-2 | AVAILABLE |
| d3 | T2 | I1-2 | AVAILABLE |
| d4 | T2 | I1-2 | UNAVAILABLE |
| d5 | T3 | I2-3 | AVAILABLE |
| d6 | T3 | I2-3 | UNAVAILABLE |
| ... | | | |

FIG. 10

| CONSUMER ID | ... | YYMMDD 0:00 | YYMMDD 0:30 | YYMMDD 1:00 | YYMMDD 1:30 | ... |
|---|---|---|---|---|---|---|
| d1 | 0.50 | 0.53 | 0.60 | 0.65 | 0.42 | ... |
| d2 | 0.55 | 0.65 | 0.62 | 0.71 | 0.78 | ... |
| d3 | 0.60 | 0.51 | 0.44 | 0.40 | 0.37 | ... |
| ... | | | | | | |

| POWER DISTRIBUTION SECTION ID | ... | YYMMDD 0:00 | YYMMDD 0:30 | YYMMDD 1:00 | YYMMDD 1:30 | ... |
|---|---|---|---|---|---|---|
| I1-2-a | 60 | 63 | 60 | 62 | 58 | ... |
| I1-2-b | 65 | 65 | 62 | 61 | 68 | ... |
| I1-2-c | 60 | 61 | 64 | 60 | 67 | ... |
| I1-3-a | 50 | 53 | 60 | 52 | 58 | ... |
| I1-3-b | 55 | 55 | 52 | 61 | 58 | ... |
| I1-3-c | 51 | 52 | 55 | 57 | 56 | ... |
| ... | | | | | | |

TRANSFORMER CONNECTION PHASE DETERMINATION PROGRAM, DEVICE, AND METHOD

CROSS-REFERENCE TO RELATED APPLICATION

This application is based upon and claims the benefit of priority of the prior Japanese Patent Application No. 2020-135230, filed on Aug. 7, 2020, the entire contents of which are incorporated herein by reference.

FIELD

The disclosed technology relates to a transformer connection phase determination program, a transformer connection phase determination device, and a transformer connection phase determination method.

BACKGROUND

Conventionally, proposed is a transformer connection phase determination device that determines to which phase of high-voltage power distribution lines a transformer connected to a consumer who consumes power on a secondary side is connected on a primary side. For example, this device calculates phase current caused by power consumed by at least one consumer connected to the transformer connected to any one of the phases corresponding to combinations of two of a plurality of power distribution lines. Then, this device calculates each correlation coefficient between the phase current and each of line currents flowing through each of a plurality of power distribution lines, and determines that the phase obtained by combining the power distribution lines other than the power distribution line corresponding to the line current with the minimum correlation coefficient is the phase to which the transformer is connected.

Example of the related art includes Japanese Laid-open Patent Publication No. 2015-094752.

SUMMARY

According to an aspect of the embodiments, a non-transitory computer-readable medium storing a transformer connection phase determination program that causes at least one computer to execute a process, the process includes, calculating, for each of a plurality of groups each of which is a combination of two power distribution lines selected from a plurality of power distribution lines, an index value that indicates a correlation between time-series data of a sum of line currents that flow through the two power distribution lines included in a group and time-series data of consumed power consumed by at least one consuming subject coupled to a transformer coupled to any one of phases that corresponds to combinations of two of the plurality of power distribution lines or current that corresponds to the power; and determining that a phase that corresponds to the group that corresponds to the index value indicating a highest correlation among the plurality of groups is a connection phase to which the transformer is coupled.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 9 is a view illustrating an example of a power distribution information DB;

FIG. 10 is a view illustrating an example of a power consumption data DB; and

FIG. 11 is a view illustrating an example of a line current data DB.

DESCRIPTION OF EMBODIMENTS

Hereinafter, an example of an embodiment of the disclosed technology is described in detail with reference to the drawings.

In the conventional technology, it is assumed that the connection to the transformer of the consumer is a single-phase three-wire system, and a case where imbalance in load to each power distribution line occurs by power consumption by the consumer as in a case where the connection of a single-phase two-wire system is mixed is not taken into consideration, or the like. Therefore, there is a problem that it is not possible to accurately determine the connection phase of the transformer by the method of the conventional technology in a case where the imbalance in load occurs.

According to an aspect, an object of the disclosed technology is to accurately determine the connection phase of the transformer in consideration of the imbalance in load on each power distribution line.

According to an aspect, there is an effect that the connection phase of the transformer may be accurately determined in consideration of the imbalance in load on each power distribution line.

Figure 1:
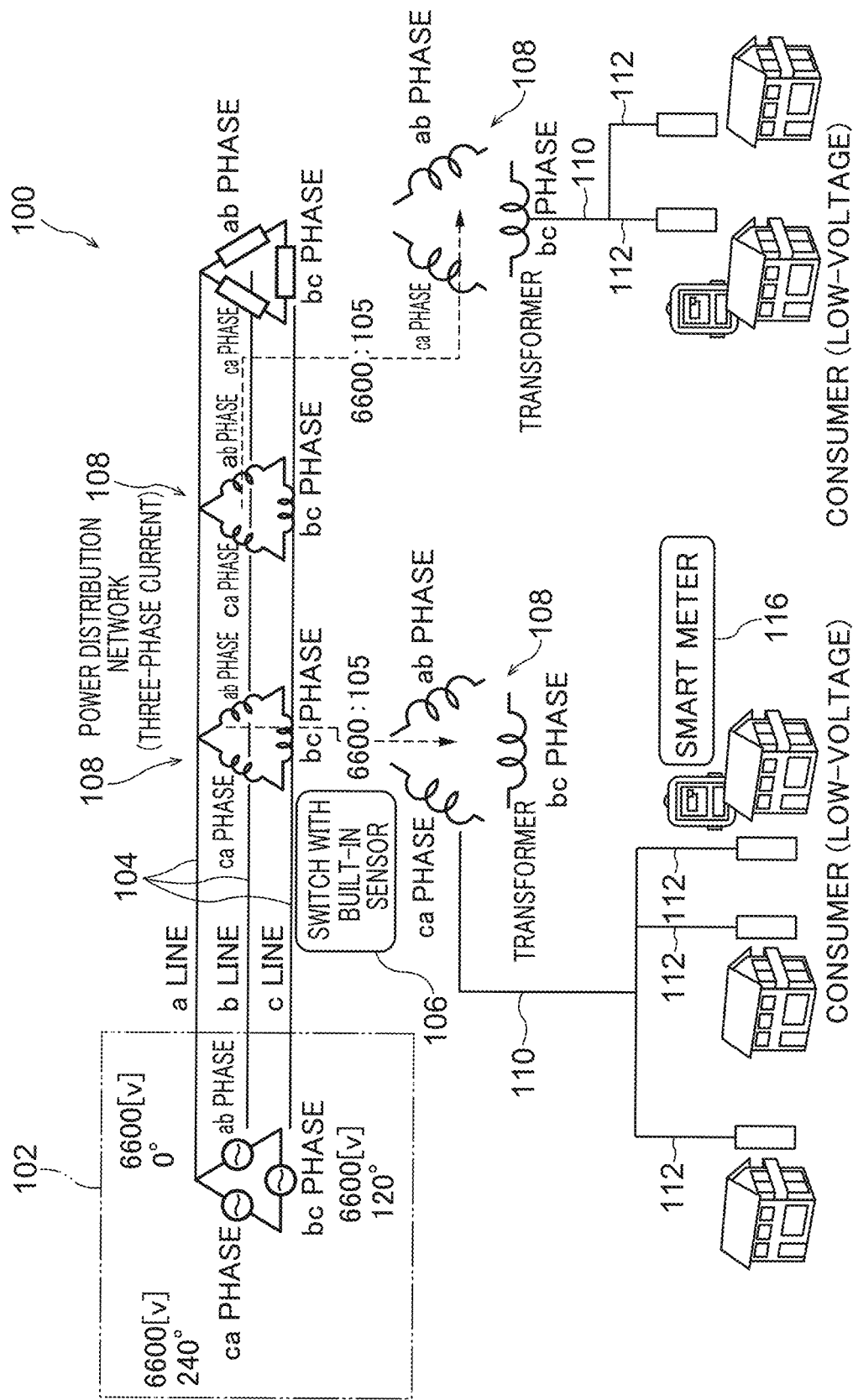
FIG. 1 is a schematic diagram illustrating an example of a power distribution network.

First, an example of a power distribution network is described with reference to FIG. 1. A power distribution network 100 illustrated in FIG. 1 includes a power distribution substation 102 that generates three-phase high-voltage (for example, 6.6 kV) AC power. In the example in FIG. 1, a power distribution system is a three-phase three-wire system, and one ends of three high-voltage power distribution lines 104 are connected to the power distribution substation 102. The three-phase high-voltage AC power generated at the power distribution substation 102 is transmitted through the three high-voltage power distribution lines 104. Note that, hereinafter, in a case where the three high-voltage power distribution lines 104 are distinguished from one another, they are referred to as a, b, and c lines, respectively.

A switch with built-in sensor 106 is installed in the middle of the high-voltage power distribution lines 104, and the switch with built-in sensor 106 measures each of line current $I_a$ of the a line, line current $I_b$ of the b line, and line current $I_c$ of the c line, for example, in units of 30 minutes. Hereinafter, in a case where the line currents $I_a$, $I_b$, and $I_c$ are collectively called, a reference sign of line current Ix (where x is any one of a, b, and c) is used.

To the high-voltage power distribution lines 104, a primary side of a single-phase transformer 108 is connected in each of a plurality of positions different from each other on downstream side of an installation position of the switch with built-in sensor 106 in a power transmission direction of the AC power. The number of transformers 108 connected to the high-voltage power distribution lines 104 is, for example, about several tens to several hundreds. Since there are three high-voltage power distribution lines 104, there are three possibilities of combinations of the high-voltage power distribution lines 104 to which the transformer 108 is connected, that is, for example, connection phases. Note that, most of the transformers 108 are actually single-phase transformers, but in FIG. 1, the three-phase transformer 108 is represented in order to express that there are three possibilities of connection phases of the transformer 108. Hereinafter, the possible connection phases of the transformer 108 are referred to as ab, bc, and ca phases, respectively.

One ends of a plurality of low-voltage power distribution lines 110 are connected to a secondary side of each transformer 108, and single-phase low-voltage (for example, 105 V) AC power converted by the transformer 108 is transmitted through the plurality of low-voltage power distribution lines 110. A service drop 112 corresponding to an individual consumer is connected to the low-voltage power distribution line 110 at each of a plurality of sites close to the individual consumers. The single-phase low-voltage AC power is supplied to the individual consumer via the low-voltage power distribution line 110 and the service drop 112. Note that, the number of consumers under one transformer 108 is, for example, about five to ten. In FIG. 1, the corresponding service drops 112 represent the number of consumers connected to the same low-voltage power distribution line 110 connected to the secondary side of one transformer 108. Note that, the consumer is an example of a "consuming subject" of the disclosed technology.

Furthermore, a power meter with communication function (smart meter 116) is installed at a part of the consumers. A power consumption amount P of the consumer with the smart meter 116 installed is measured by the smart meter 116 in units of 30 minutes, for example, and a measurement result is transmitted to a power distribution operator and the like via a communication line not illustrated.

Figure 2:
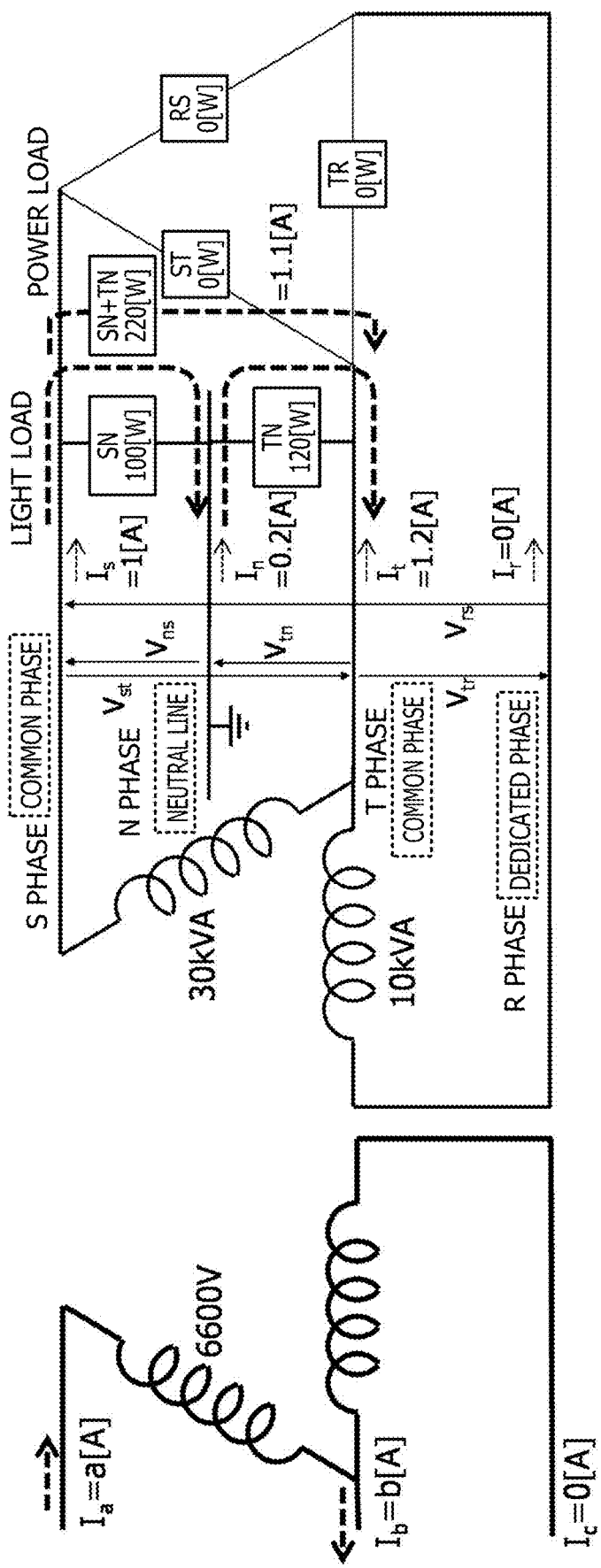
FIG. 2 is a view for illustrating a single-phase three-wire system.
Figure 3:
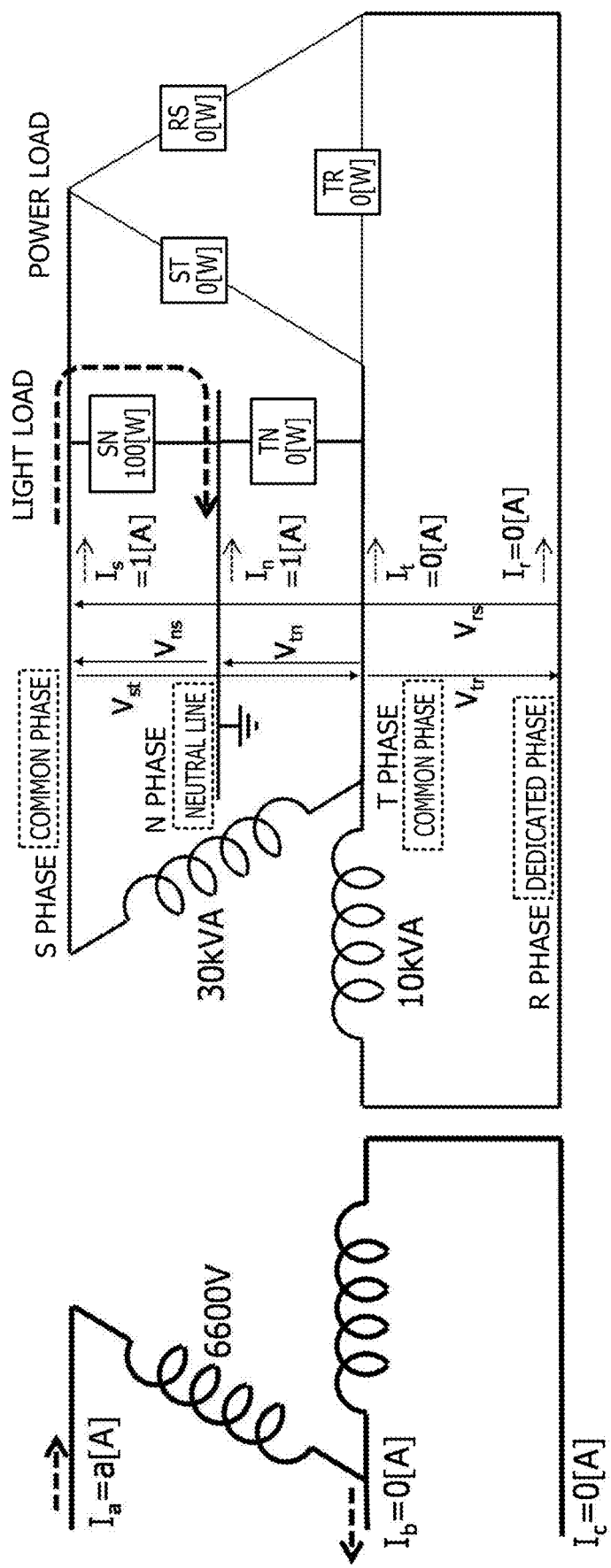
FIG. 3 is a view for illustrating a single-phase two-wire system.

Here, about five to ten consumers are connected under each actual transformer, and there is a case where the single-phase three-wire system as illustrated in FIG. 2 and a single-phase two-wire system as illustrated in FIG. 3 are mixed as a connection system thereof. Note that, FIGS. 2 and 3 illustrate a case where the transformer is connected to the ab phase of the high-voltage power distribution lines.

As illustrated in FIG. 2, in the single-phase three-wire system, on the secondary side of the transformer, power is consumed by light loads (SN, TN, and SN+TN) connected between an S phase and an N phase, between a T phase and the N phase, and between the S phase and the T phase, respectively, of the low-voltage power distribution lines. Therefore, currents $I_s$ and $I_t$ flow through the power distribution lines of shared phases (S phase and T phase), respectively, and current $I_n$ flows through a neutral line. Note that, since a power load in a three-phase three-wire circuit on the secondary side of the transformer is 0, that is, for example, an open state, no current flows through the three-phase three-wire circuit. Then, on the primary side of the transformer, current flows through two lines of the high-voltage power distribution lines. Since the transformer is connected to the ab phase in an example in FIG. 2, the currents $I_a$ and $I_b$ flow through the a and b lines of the high-voltage power distribution lines, respectively.

In the above-described conventional technology, a case is assumed where the connection system of the consumer to the transformer is only the single-phase three-wire system as illustrated in FIG. 2, and the power consumption by each light load is balanced. In such a case, in the high-voltage power distribution lines, a difference between the two lines through which the current flows and one line through which the current does not flow is clear, so that it is possible to determine the transformer connection phase by analyzing a correlation between the line current of each line of the high-voltage power distribution lines and the power consumption of the consumer. For example, assuming that a correlation coefficient between the power consumption P and the line current $I_x$ is set to $\rho_{P,Ix}$, in the conventional technology, a determination logic is based on the assumption that the size of the correlation coefficients are roughly in a relationship as expressed below. Note that, in the following relational expression, a symbol "~" represents that the right side and the left side are substantially equal to each other.

$$\rho_{P,Ia} \sim \rho_{P,Ib} > \rho_{P,Ic}$$

(case where transformer connection phase is ab phase)

However, as illustrated in FIG. 3, in the single-phase two-wire system, on the secondary side of the transformer, the power is consumed by the light load (SN or TN) connected between the S phase and the N phase (or between the T phase and the N phase) of the low-voltage power distribution lines. Therefore, the current $I_s$ flows through the power distribution line of the shared phase (S phase) (or the current $I_t$ flows through the power distribution line of the shared phase (T phase)), and the current $I_n$ flows through the neutral line. Then, on the primary side of the transformer, the current flows through one line of the high-voltage power distribution lines. Since the transformer is connected to the ab phase in an example in FIG. 3, the current $I_a$ flows through the a line of the high-voltage power distribution lines (or the current $I_b$ flows through the b line). In this manner, in the single-phase two-wire system, the line current is generated in only one line of the high-voltage power distribution lines, so that imbalance in line current between the two lines in which the line currents are assumed to be generated in the conventional technology becomes large. For example, in the example in FIG. 3, a relationship such as $\rho_{P,Ia} > \rho_{P,Ib} > \rho_{P,Ic}$ might occur. Furthermore, depending on a condition such as line noise, even in a case where the transformer connection phase is the ab phase, there might be a case where $\rho_{P,Ic}$ is not minimized. In such a case, in a determination algorithm in the conventional technology, a correct answer rate of the determination of the transformer connection phase decreases.

Figure 4:
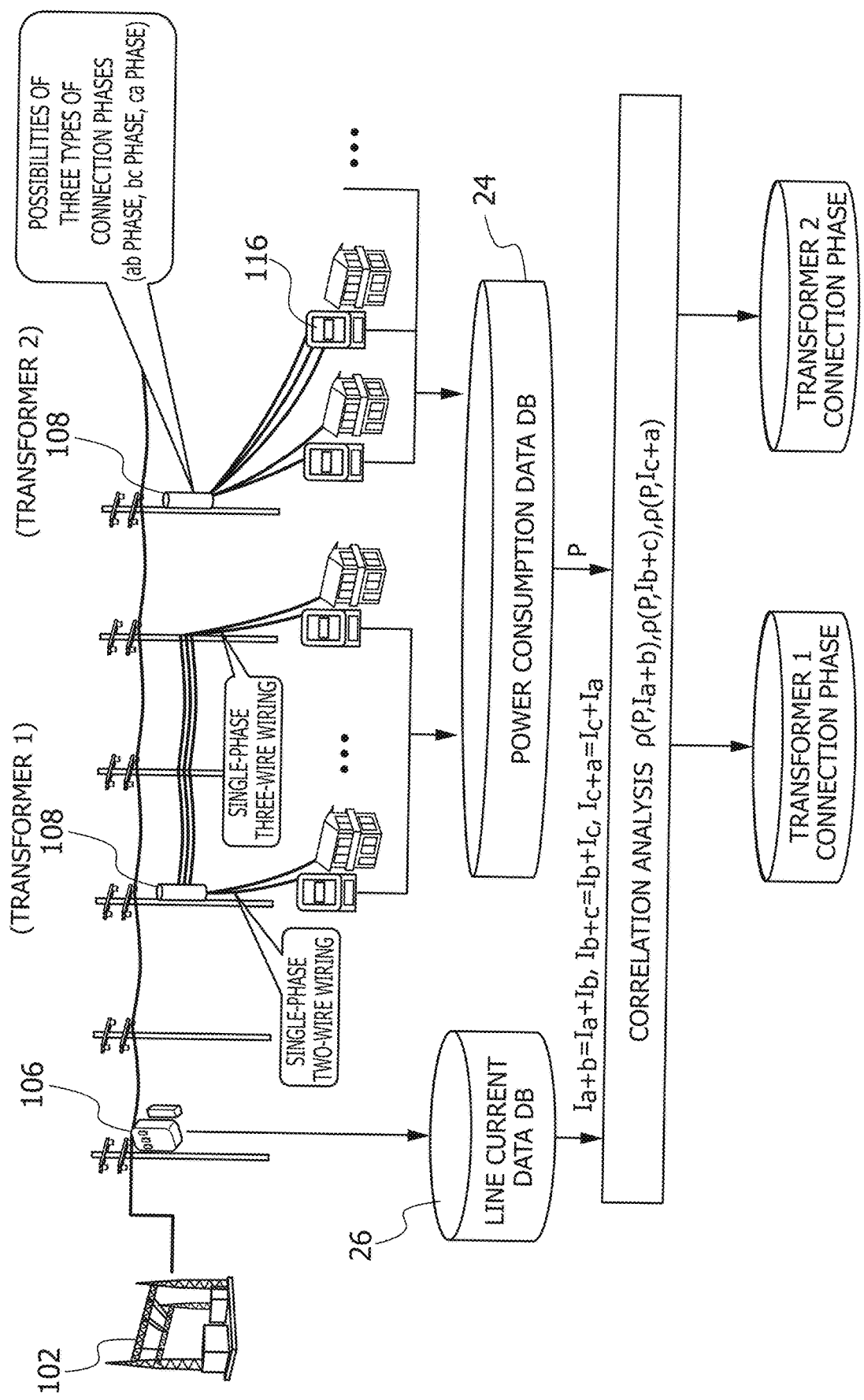
FIG. 4 is a view illustrating an outline of this embodiment.

Therefore, an object of this embodiment is to accurately determine the transformer connection phase even in a case where the load to each high-voltage power distribution line 104 is imbalanced, for example, as in a case where the single-phase two-wire system and the single-phase three-wire system are mixed as the connection system of the consumer connected to each transformer 108 as illustrated in FIG. 4.

Figure 5:
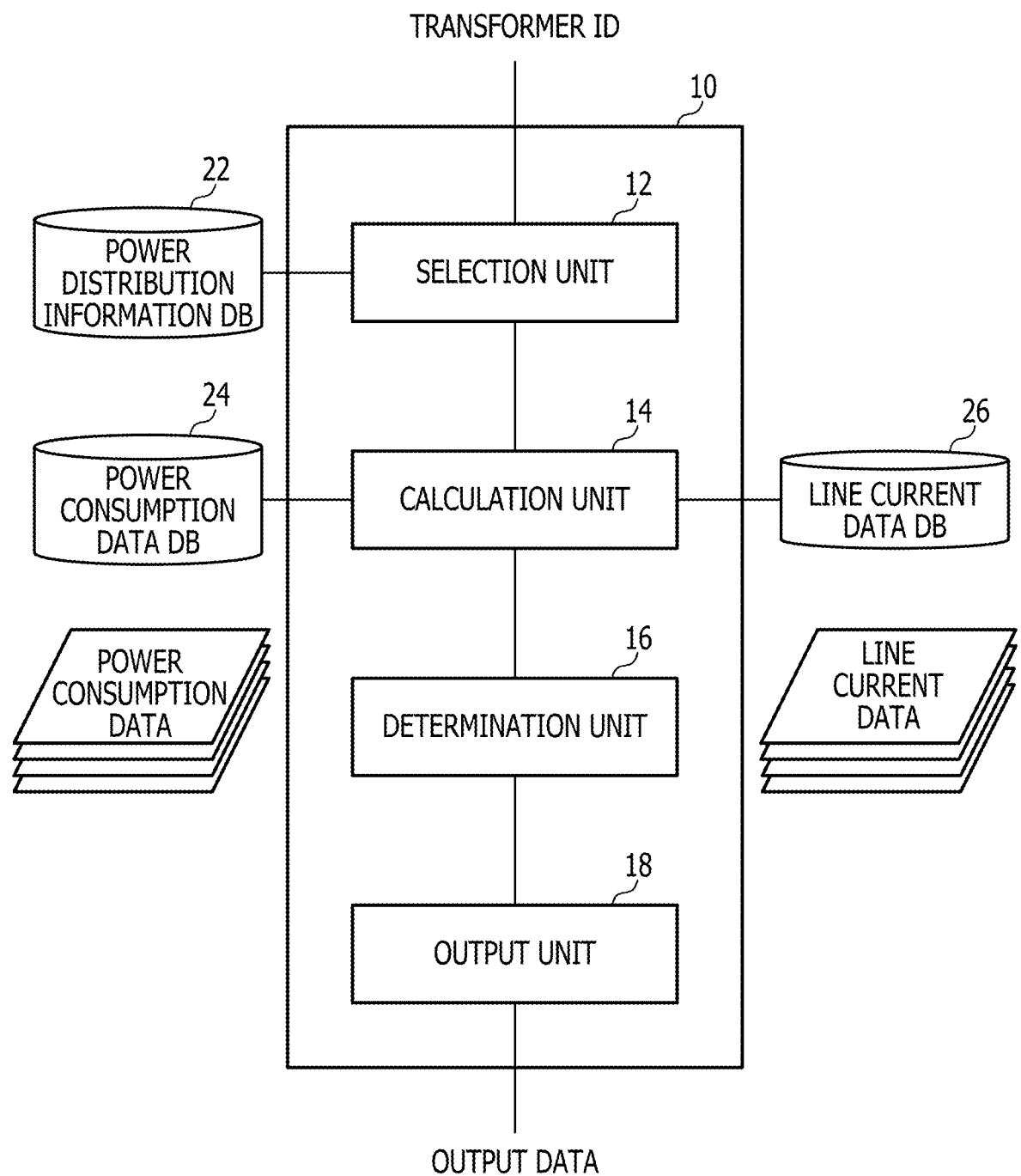
FIG. 5 is a functional block diagram of a transformer connection phase determination device.

As illustrated in FIG. 5, a transformer connection phase determination device 10 according to this embodiment is provided with a selection unit 12, a calculation unit 14, a determination unit 16, and an output unit 18.

The selection unit 12 receives a transformer ID being identification information of the transformer the connection phase of which is to be determined as an input, and selects a power distribution section and the consumer corresponding to the transformer ID.

Figure 6:
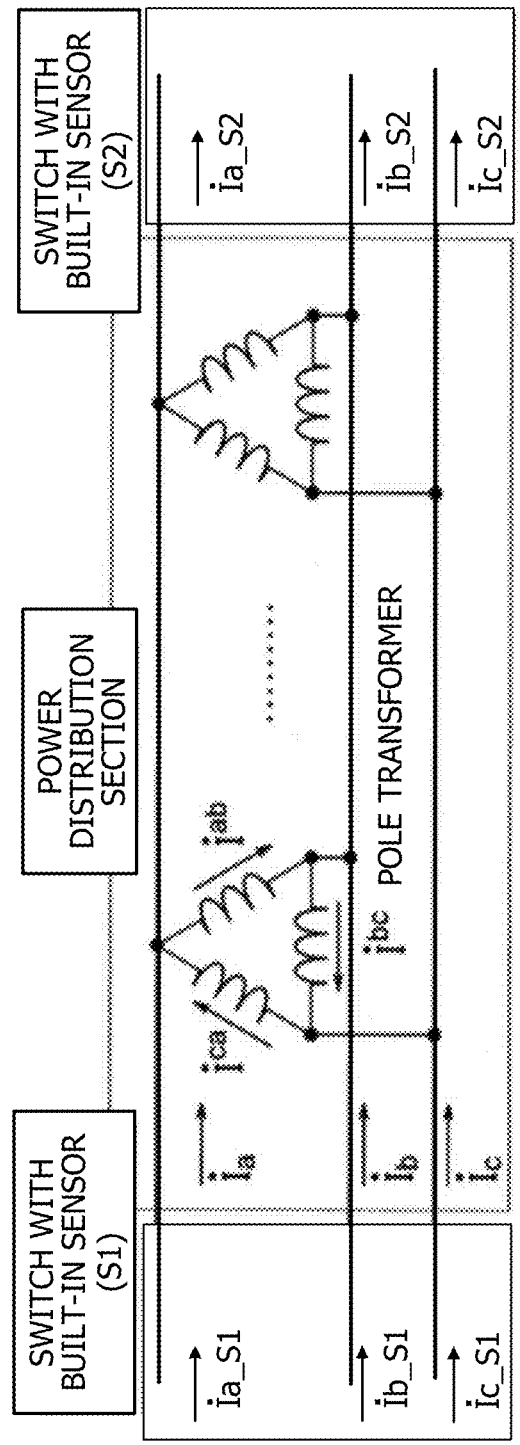
FIG. 6 is a view expressing a power distribution system by a virtual circuit configuration.

Here, the power distribution section is described. For example, a power distribution system as illustrated in FIG. 6 is considered. An example in FIG. 6 is a three-phase three-wire circuit, and a transformer (pole transformer) is assumed to be a three-phase transformer virtually connected by delta connection. The single-phase three-wire system or the single-phase two-wire system is used in most transformers in an actual power distribution system, and usually only one phase is used, but in FIG. 6, the power distribution system is expressed by a virtual circuit configuration in order to illustrate that there is a plurality of possibilities of connection phases. In this embodiment, a section interposed between two switches with built-in sensor is referred to as the "power distribution section". Furthermore, as described above, the consumer is connected to the secondary side of the transformer.

A correspondence relationship between the power distribution section and the transformer belonging to the power distribution section, and a correspondence relationship between the transformer and the consumer connected to the transformer are stored in a power distribution information database (DB) 22 as power distribution information. The selection unit 12 refers to the power distribution information stored in the power distribution information DB 22 and selects the power distribution section and the consumer corresponding to the received transformer ID.

The calculation unit 14 reads time-series data of the power consumption of the consumer selected by the selection unit 12 from a power consumption data DB 24. The power consumption data DB 24 stores the time-series data of the power consumption of each consumer measured in units of 30 minutes, for example, by the smart meter 116 installed at the consumer. I$_n$ a case where a plurality of consumers is selected by the selection unit 12, the calculation unit 14 adds up the time-series data of the power consumption of each consumer, and calculates the same as time-series data P(t) of the power consumption of one virtual consumer.

Furthermore, the calculation unit 14 reads time-series data of the line current in the selected power distribution section from a line current data DB 26. The time-series data of the line current may be obtained from a current value measured by the switches with built-in sensor 106 that define both ends of the power distribution section. The line current data DB 26 stores time-series data $I_x(t)$ of the line current for each power distribution section and for each high-voltage power distribution line 104 measured by the switch with built-in sensor in units of 30 minutes, for example.

The calculation unit 14 calculates, for each of a plurality of groups being combinations of two high-voltage power distribution lines 104 selected from a plurality of high-voltage power distribution lines 104 (a line, b line, and c line), time-series data of the sum of the line currents flowing through the two high-voltage power distribution lines 104 included in the group. That is, for example, the calculation unit 14 calculates $I_{a+b}(t)=I_a(t)+I_b(t)$, $I_{b+c}(t)=I_b(t)+I_c(t)$, and $I_{c+a}(t)=I_c(t)+I_a(t)$. This utilizes a fact that, even in a case where the connection system to the transformer 108 of the consumer is the single-phase two-wire system, the current flows on the high-voltage power distribution line 104 side through any one of the two lines corresponding to the phase to which the transformer 108 is connected. Specifically, for example, utilized is a fact that it is highly possible that $I_a+I_b$ becomes larger than $I_b+I_c$ and $I_c+I_a$ in a case where the transformer is connected to the ab phase, for example, and the single-phase three-wire system and the single-phase two-wire system are mixed as the connection system to the transformer 108 of the consumer. Note that, the calculation unit 14 may calculate time-series data of an average of the line currents in place of the sum of the line currents flowing through the two high-voltage power distribution lines 104 included in the group.

Then, the calculation unit 14 calculates an index value indicating a correlation between the time-series data of the sum of the line currents and the time-series data of the power consumption of the consumer. For example, the calculation unit 14 calculates a correlation coefficient expressed by following expression (1) as the index value indicating the correlation.

$$\rho_T = \frac{\sigma_{fg}}{\sigma_f \sigma_g} = \frac{\frac{1}{T}\sum_{t=1}^{T} f(t)g(t)}{\sqrt{\frac{1}{T}\sum_{t=1}^{T} f(t)^2}\sqrt{\frac{1}{T}\sum_{t=1}^{T} g(t)^2}} = \frac{\sum_{t=1}^{T} f(t)g(t)}{\sqrt{\sum_{t=1}^{T} f(t)^2}\sqrt{\sum_{t=1}^{T} g(t)^2}} \quad (1)$$

Here, f(t) represents time-series data obtained by centralized by subtraction of an average value of values in the time-series data from a value of each sampling point of the time-series data P(t) of the power consumption of the consumer. g(t) represents time-series data obtained by centralized by subtraction of an average value of values in the time-series data from a value of each sampling point of time-series data $I_y(t)$ (y is a+b, b+c, or c+a) of the line current. $\rho_T$ represents a correlation coefficient in a time domain between f(t) and g(t) and takes a value of $-1 \leq \rho_T \leq 1$. $\sigma_{fg}$ represents a covariance of f(t) and g(t), $\sigma_f$ represents standard deviation of f(t), $\sigma_g$ represents standard deviation of g(t), and T represents the number of sampling points in the time-series data.

By expression (1) described above, the calculation unit 14 calculates a correlation coefficient $\rho_T(P, I_{a+b})$ between P(t) and $I_{a+b}(t)$, a correlation coefficient $\rho_T(P, I_{b+c})$ between P(t) and $I_{b+c}(t)$, and a correlation coefficient $\rho_T(P, I_{c+a})$ between P(t) and $I_{c+a}(t)$.

The determination unit 16 determines that the phase corresponding to the group of the line currents corresponding to the highest correlation coefficient among the three types of correlation coefficients calculated by the calculation unit 14 as the connection phase to which the transformer to be determined is connected. That is, for example, the determination unit 16 determines that the ab phase is the connection phase in a case where $\rho_T(P, I_{a+b})$ is the maximum, determines that the bc phase is the connection phase in a case where $\rho_T(P, I_{b+c})$ is the maximum, and determines that the ca phase is the connection phase in a case where $\rho_T(P, I_{c+a})$ is the maximum.

The output unit 18 processes a determination result by the determination unit 16 into a format capable of being displayed on a display device, printed by a printing device and the like to output.

Figure 7:
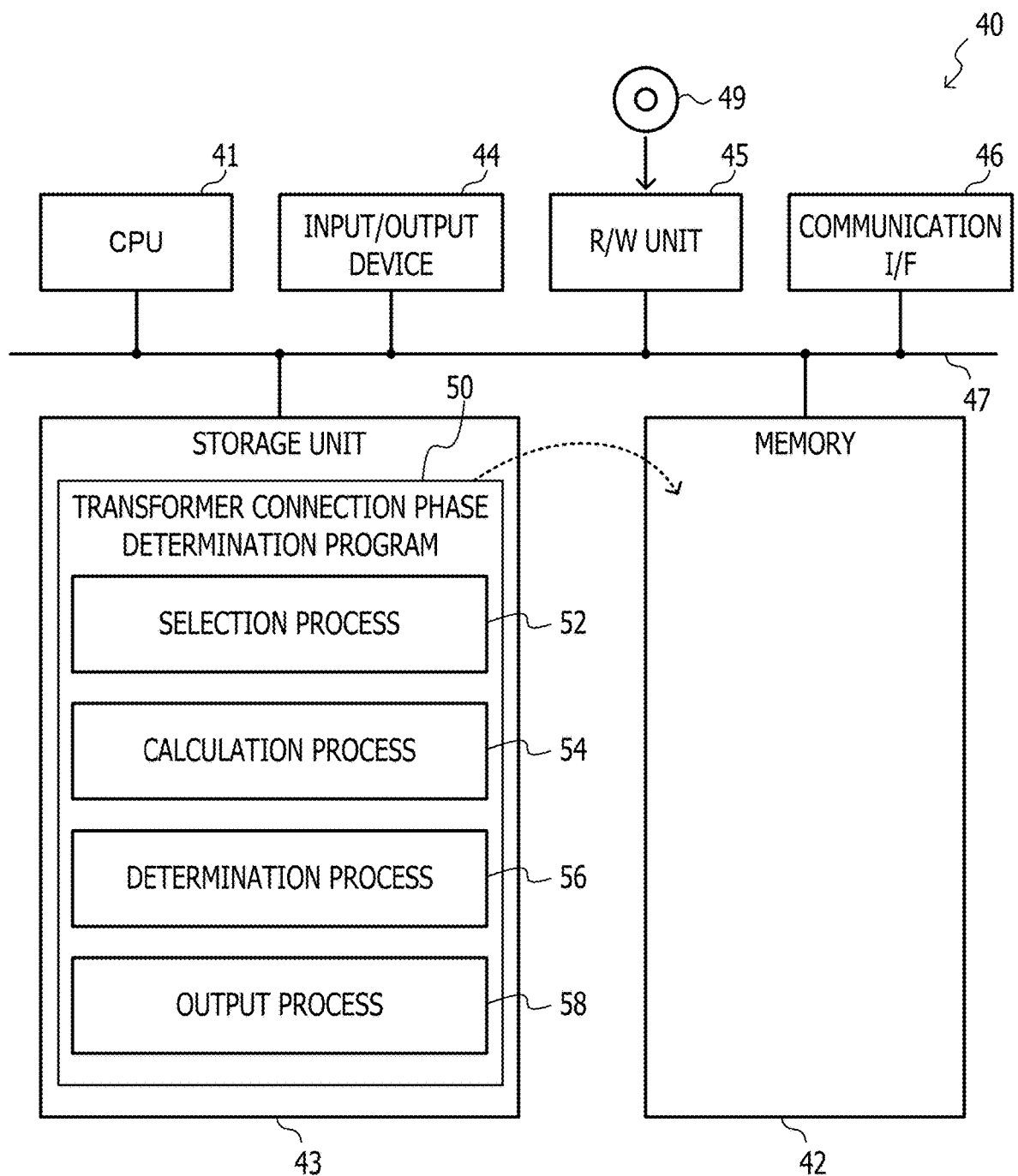
FIG. 7 is a block diagram illustrating a schematic configuration of a computer that serves as the transformer connection phase determination device.

The transformer connection phase determination device 10 may be implemented, for example, by a computer 40 illustrated in FIG. 7. The computer 40 is provided with a central processing unit (CPU) 41, a memory 42 as a temporary storage area, and a non-volatile storage unit 43. Furthermore, the computer 40 is provided with an input/output device 44 such as an input unit and a display unit, a read/write (R/W) unit 45 that controls reading and writing of data from and to a storage medium 49. Furthermore, the computer 40 is provided with a communication interface (I/F) 46 connected to a network such as the Internet. The CPU 41, the memory 42, the storage unit 43, the input/output device 44, the R/W unit 45, and the communication I/F 46 are connected to one another via a bus 47.

The storage unit 43 may be implemented by a hard disk drive (HDD), a solid state drive (SSD), a flash memory and the like. The storage unit 43 as a storage medium stores a transformer connection phase determination program 50 for causing the computer 40 to serve as the transformer connection phase determination device 10. The transformer connection phase determination program 50 includes a selection process 52, a calculation process 54, a determination process 56, and an output process 58.

The CPU 41 reads the transformer connection phase determination program 50 from the storage unit 43, expands the same in the memory 42, and sequentially executes the processes included in the transformer connection phase determination program 50. The CPU 41 executes the selection process 52 to operate as the selection unit 12 illustrated in FIG. 5. Furthermore, the CPU 41 executes the calculation process 54 to operate as the calculation unit 14 illustrated in FIG. 5. Furthermore, the CPU 41 executes the determination process 56 to operate as the determination unit 16 illustrated in FIG. 5. Furthermore, the CPU 41 executes the output process 58 to operate as the output unit 18 illustrated in FIG. 5. Therefore, the computer 40 that executes the transformer connection phase determination program 50 serves as the transformer connection phase determination device 10. Note that, the CPU 41 that executes the program is hardware.

Note that, the function implemented by the transformer connection phase determination program 50 may also be implemented, for example, by a semiconductor integrated circuit, in further detail, an application specific integrated circuit (ASIC) and the like.

Figure 8:
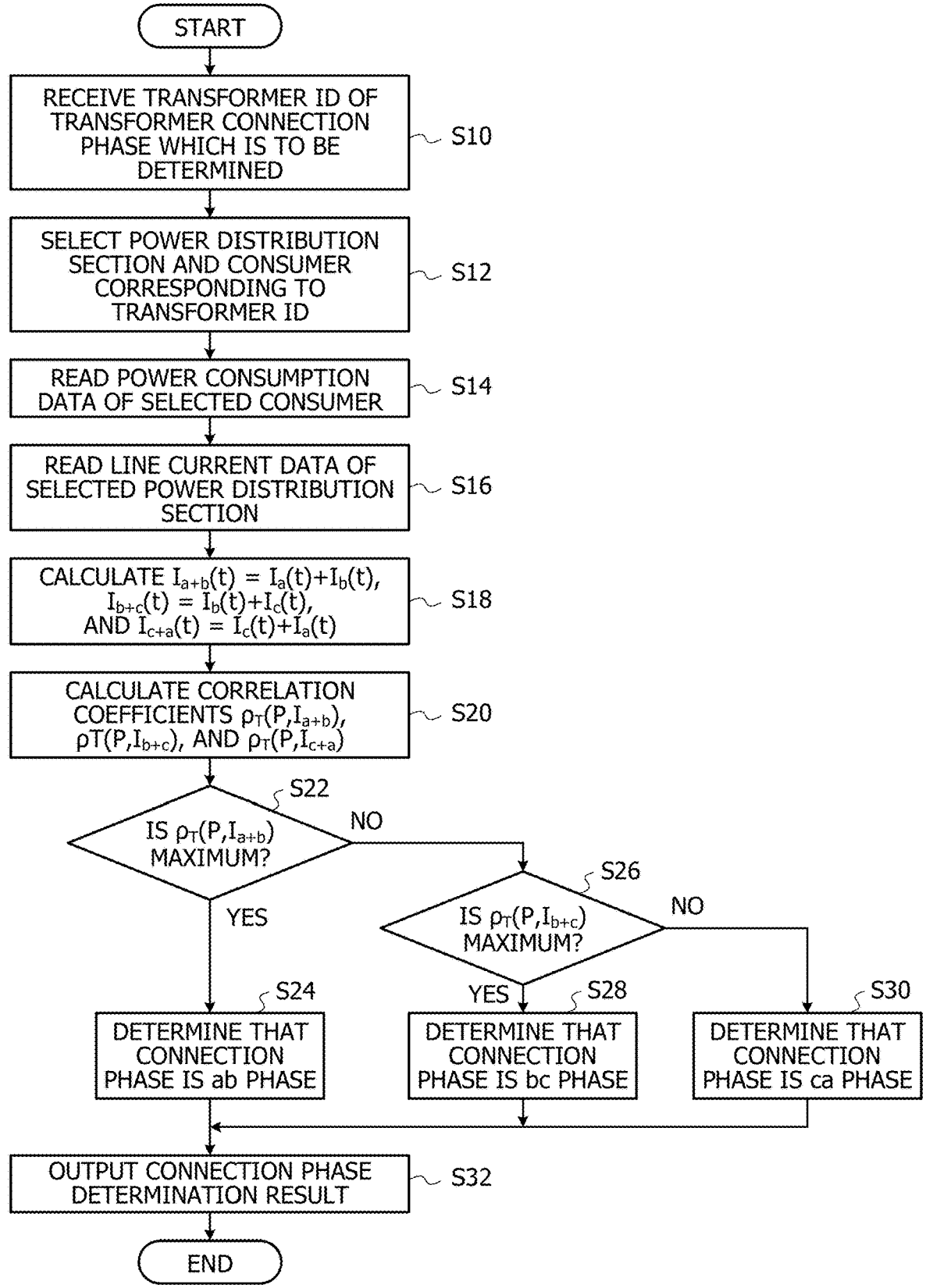
FIG. 8 is a flowchart illustrating an example of a transformer connection phase determination process.

Next, an action of the transformer connection phase determination device 10 according to this embodiment is described. As illustrated in FIG. 4, a plurality of consumers is connected to the secondary side of the transformer 108 the primary side of which is connected to the high-voltage power distribution lines 104 in a state in which the single-phase two-wire system and the single-phase three-wire system are mixed. The line current of each line of the high-voltage power distribution lines 104 measured by the switch with built-in sensor 106 is stored in the line current data DB 26, and the power consumption of the consumer measured by the smart meter 116 is stored in the power consumption data DB 24. Then, when the transformer ID indicating the transformer 108 the connection phase of which is to be determined is input to the transformer connection phase determination device 10, the transformer connection phase determination device 10 executes a transformer connection phase determination process illustrated in FIG. 8. Note that, the transformer connection phase determination process is an example of a transformer connection phase determination method of the disclosed technology.

At step S10, the selection unit 12 receives the input transformer ID.

Next, at step S12, the selection unit 12 selects the power distribution section and the consumer corresponding to the received transformer ID from the power distribution information DB 22. FIG. 9 illustrates an example of the power distribution information DB 22. In the power distribution information DB 22 illustrated in FIG. 9, for each consumer, a consumer ID being identification information of the consumer, the transformer ID being the identification information of the transformer 108 to which the consumer is connected, and a power distribution section ID being identification information of the power distribution section to which the transformer 108 belongs are stored in association with each other. Here, as illustrated in FIG. 6, assumed is the power distribution system in which many power distribution sections interposed between the switches with built-in sensor installed on upstream and downstream sides of the power distribution system are connected in series. Then, for example, the power distribution section ID indicating the power distribution section interposed between a switch with built-in sensor (S1) and a switch with built-in sensor (S2) is defined as "I1-2". Furthermore, the power distribution information DB 22 illustrated in FIG. 9 includes a data availability flag indicating whether the power consumption data of each consumer is available. For example, in a case where the smart meter 116 installed at the consumer is connected to the transformer connection phase determination device 10 via the network, the data availability flag is set to "available" assuming that the power consumption data of the consumer is available.

Therefore, the selection unit 12 selects the consumer ID and the power distribution section ID associated with the transformer ID that matches with the transformer ID received at step S10 described above from the power distribution information DB 22. Note that, when selecting the consumer ID, the selection unit 12 selects the one with the data availability flag "available". Furthermore, the selection unit 12 selects a plurality of consumer IDs in a case where there is a plurality of appropriate consumer IDs.

Next, at step S14, the calculation unit 14 reads the power consumption data corresponding to the consumer ID selected at step S12 described above from the power consumption data DB 24. FIG. 10 illustrates an example of the power consumption data DB 24. In the power consumption data DB 24 illustrated in FIG. 10, the power consumption amount [kWh] measured at a constant sampling time interval (30 minutes in the example in FIG. 10) by the smart meter 116 is accumulated as the time-series data of the power consumption of each consumer.

In a case where the number of consumer IDs selected at step S12 described above is one, the calculation unit 14 reads the power consumption data corresponding to the consumer ID as it is from the power consumption data DB 24. For example, in the examples in FIGS. 9 and 10, in a case where the transformer ID=T1 is input, only the consumer ID=d1 is selected, so that the calculation unit 14 reads the power consumption data corresponding to the consumer ID=d1 as it is from the power consumption data DB 24.

Furthermore, in a case where there is a plurality of consumer IDs selected at step S12 described above, the calculation unit 14 reads a plurality of power consumption data corresponding to a plurality of consumer IDs. Then, the calculation unit 14 adds up the power consumption amount at each sampling time of a plurality of power consumption data to create the power consumption data of one virtual consumer. For example, in the examples in FIGS. 9 and 10, in a case where the transformer ID=T2 is input, the consumer IDs=d2 and d3 are selected. Note that, d4 is not selected because the data availability flag is "unavailable". Then, the calculation unit 14 reads the power consumption data corresponding to the consumer ID=d2 and the power consumption data corresponding to the consumer ID=d3 from the power consumption data DB 24. Then, the calculation unit 14 creates the power consumption data of one virtual consumer such as the power consumption amount at "0:00"=0.65+0.51=1.16 and the power consumption amount at "0:30"=0.62+0.44=1.06 . . . . Therefore, an S/N ratio of the power consumption data is improved as compared with a case where the power consumption data corresponding to the individual consumer ID is used as it is, and accuracy of the correlation coefficient calculated in a subsequent process is improved.

Next, at step S16, the calculation unit 14 reads three types of line currents in the power distribution section indicated by the power distribution section ID selected at step S12 described above from the line current data DB 26. FIG. 11 illustrates an example of the line current data DB 26. In the line current data DB 26 illustrated in FIG. 11, a net current value [A] measured at a constant sampling time interval (30 minutes in the example in FIG. 8) in each of the a, b, and c lines in the power distribution section indicated by the power distribution section ID is accumulated as the time-series data of the line current. The calculation unit 14 calculates the time-series data $I_x(t)$ of the line current by subtracting a measured value by the switch with built-in sensor (S2) located downstream the selected power distribution section from a measured value by the switch with built-in sensor (S1) located upstream the selected power distribution section.

Next, at step S18, the calculation unit 14 calculates $I_{a+b}(t)=I_a(t)+I_b(t)$, $I_{b+c}(t)=I_b(t)+I_c(t)$, and $I_{c+a}(t)=I_c(t)+I_a(t)$ from the line current $I_x(t)$ ($x \in \{a,b,c\}$).

Next, at step S20, the calculation unit 14 calculates a correlation coefficient between the time-series data P(t) of the power consumption of the consumer read at step S14 described above and the time-series data $I_y(t)$ ($y \in \{a+b, b+c, c+a\}$) of the sum of the line currents for each group calculated at step S18 described above. Specifically, for example, the calculation unit 14 calculates a correlation coefficient $\rho_T(P,I_{a+b})$ between P(t) and $I_{a+b}(t)$, a correlation coefficient $\rho_T(P,I_{b+c})$ between P(t) and $I_{b+c}(t)$, and a correlation coefficient $\rho_T(P,I_{c+a})$ between P(t) and $I_{c+a}(t)$ by expression (1) described above.

Next, at step S22, the determination unit 16 determines whether the correlation coefficient $\rho_T(P,I_{a+b})$ is the maximum among the three types of correlation coefficients calculated at step S20 described above. In a case where the correlation coefficient $\rho_T(P,I_{a+b})$ is the maximum, the procedure shifts to step S24, and in a case where the correlation coefficient $\rho_T(P,I_{a+b})$ is not the maximum, the procedure shifts to step S26. At step S24, the determination unit 16 determines that the connection phase of the transformer indicated by the transformer ID received at step S10 is the ab phase.

In contrast, at step S26, it is determined whether the correlation coefficient $\rho_T(P,I_{b+c})$ is the maximum among the three types of correlation coefficients calculated at step S20 described above. In a case where the correlation coefficient $\rho_T(P,I_{b+c})$ is the maximum, the procedure shifts to step S28, and in a case where the correlation coefficient $\rho_T(P,I_{b+c})$ is not the maximum, the procedure shifts to step S30. At step S28, the determination unit 16 determines that the connection phase of the transformer indicated by the transformer ID received at step S10 is the bc phase.

In a case where the procedure shifts to step S30, that is, for example, in a case where it is negatively determined at steps S22 and S26, the correlation coefficient $\rho_T(P,I_{c+a})$ is the maximum, so that the determination unit 16 determines that the connection phase of the transformer indicated by the transformer ID received at step S10 is the ca phase.

Next, at step S32, the output unit 18 processes a determination result at step S24, S28, or S30 described above into a format capable of being displayed on a display device, printed by a printing device and the like to output, and the transformer connection phase determination process ends.

As described above, the transformer connection phase determination device according to this embodiment calculates the time-series data of the sum of the line currents flowing through the two high-voltage power distribution lines included in the group for each of a plurality of groups being the combinations of the two high-voltage power distribution lines selected from a plurality of high-voltage power distribution lines. Furthermore, the transformer connection phase determination device calculates the correlation coefficient between the time-series data of the sum of the line currents and the time-series data of the power consumption of at least one consumer connected to the transformer connected to any one of the phases corresponding to the combinations of two of a plurality of high-voltage power distribution lines. Then, the transformer connection phase determination device determines that the phase corresponding to the group of the maximum correlation coefficient among a plurality of groups is the connection phase to which the transformer is connected. Therefore, even in a case where the single-phase three-wire system and the single-phase two-wire system are mixed as the connection system to the transformer of the consumer, it is possible to accurately determine the connection phase of the transformer in consideration of imbalance in load on each power distribution line.

Note that, in the above-described embodiment, described is a case where the correlation coefficient expressed by expression (1) is calculated as the index value indicating the correlation between the time-series data of the power consumption of the consumer and the time-series data of the sum of the two line currents, but there is no limitation. Two other examples of the index value indicating the correlation are hereinafter described.

A first one of the other examples of the index value is a correlation coefficient $\rho_F$ in a frequency domain expressed by following expression (2).

$$\rho_F = \frac{1}{\sqrt{C_{ff}(0)}\sqrt{C_{gg}(0)}} \int_{-\infty}^{\infty} K_{fg}(\omega)d\omega = \qquad (2)$$

$$\frac{1}{\sqrt{\int_{-\infty}^{\infty} S_{ff}(\omega)d\omega}\sqrt{\int_{-\infty}^{\infty} S_{gg}(\omega)d\omega}} \int_{-\infty}^{\infty} \mathrm{Re}[S_{fg}(\omega)]d\omega \sim$$

$$\frac{\sum_{k=0}^{N-1} \mathrm{Re}[\hat{f}^*(\omega_k)\hat{g}(\omega_k)]}{\sqrt{\sum_{k=0}^{N-1}|\hat{f}(\omega_k)|^2}\sqrt{\sum_{k=0}^{N-1}|\hat{g}(\omega_k)|^2}}$$

Here, $K_{fg}(\omega)$ represents a cospectrum of f(t) and g(t), $C_{ff}(T)$ represents an autocorrelation function of f(t), $C_{gg}(T)$ represents an autocorrelation function of g(t), $S_{ff}(\omega)$ represents a power spectrum of f(t), and $S_{gg}(\omega)$ represents a power spectrum of g(t). Furthermore, $S_{fg}$ represents a cross spectrum of f(t) and g(t), $\hat{f}(\omega_k)$ represents a discrete Fourier spectrum of f(t), $\hat{g}(\omega_k)$ represents a discrete Fourier spectrum of g(t), and $\omega_k$ represents an angular frequency. Here, $\hat{f}^*$ represents a complex conjugate of $\hat{f}$, and Re[·] represents a function that takes a real part. Furthermore, N represents the number of sampling points of the angular frequency. Note that, representation of "x^" is "^" (hat) above "x" in the expression.

In expression (2), a first expression is transformed into a second expression by using a fact that Parseval's identity (following expression (4)) holds by following expression (3) and the like. Furthermore, a third expression in expression (2) is discretization of the second expression.

$$C_{ff}(\tau) = \lim_{T \to \infty} \frac{1}{T} \int_{-\frac{T}{2}}^{\frac{T}{2}} f(t)f(t+\tau)dt \qquad (3)$$

$$= \int_{-\infty}^{\infty} S_{ff}(\omega)e^{i\omega t}d\omega$$

$$C_{ff}(0) = \int_{-\infty}^{\infty} S_{ff}(\omega)d\omega \qquad (4)$$

By expression (2) described above, the calculation unit 14 may calculate a correlation coefficient $\rho_F(P,I_{a+b})$ between P(t) and $I_{a+b}(t)$, a correlation coefficient $\rho_F(P,I_{b+c})$ between P(t) and $I_{b+c}(t)$, and a correlation coefficient $\rho_F(P,I_{c+a})$ between P(t) and $I_{c+a}(t)$. Then, the determination unit 16 may determine that the ab phase is the connection phase in a case where $\rho_F(P,I_{a+b})$ is the maximum, determine that the bc phase is the connection phase in a case where $\rho_F(P,I_{b+c})$ is the maximum, and determine that the ca phase is the connection phase in a case where $\rho_F(P,I_{c+a})$ is the maximum.

By using the correlation coefficient in the frequency domain as described above, the time-series data of the power consumption of the consumer and the time-series data of the sum of the line currents may be made linear calculation. This facilitates application of a filter to a frequency component of each of the time-series data of the power consumption of the consumer and the time-series data of the sum of the line currents. Furthermore, this is also suitable for optimizing a filter characteristic for improving determination accuracy. As a result, the correct answer rate of the connection phase determination is improved as compared with a case where the correlation coefficient $\rho_T$ in a time domain is used.

A second one of the other examples of the index value is a correlation index $Coh_{fg}$ using a phase spectrum in a frequency domain representation expressed by following expression (5).

$$Coh_{fg} = \sum_{j=0}^{M-1} coh_{fg}(\omega_j) \qquad (5)$$

$$coh_{fg}(\omega_j) = \frac{\sum_{i=0}^{N-1} |\hat{f}_i(\omega_j)||\hat{g}_i(\omega_j)|\cos(\theta_i(\omega_j) - \eta_i(\omega_j))}{\sqrt{\sum_{i=0}^{N-1}|\hat{f}_i(\omega_j)|^2}\sqrt{\sum_{i=0}^{N-1}|\hat{g}_i(\omega_j)|^2}}$$

In expression (5), $|\hat{f}_i(\omega_j)|$ represents a Fourier amplitude spectrum of an i-th section signal $f_i(t)$, and $|\hat{g}_i(\omega_j)|$ represents a Fourier amplitude spectrum of an i-th section signal $g_i(t)$. Furthermore, $\theta_i(\omega_j)$ represents a Fourier phase spectrum of the i-th section signal $f_i(t)$, and $\eta_i(\omega_j)$ represents a Fourier phase spectrum of the i-th section signal $g_i(t)$. In expression (5) described above, smoothing by addition is performed on the Fourier spectrums of the section signals $f_i(t)$ and $g_i(t)$ (i=0, 1, 2, . . . , and N−1) obtained by dividing domains of the two types of time-series signals f(t) and g(t) into N sections. Furthermore, $coh_{fg}(\omega_j)$ in expression (5) corresponds to a real part of an amount generally referred to as a spatial complex coherence degree.

Here, suppose that the amplitude spectrum is the following constant independent from the i-th section considering that a change in amplitude is smaller than a change in phase between the Fourier spectrums for each section signal.

$|\hat{f}_i(\omega_j)|=|\hat{f}(\omega_j)|,$ $|\hat{g}_i(\omega_j)|=|\hat{g}(\omega_j)|,$ wherein i=0, 1, 2, . . . , N−1

In this case, $coh_{fg}(\omega_j)$ may be simplified as expressed by following expression (6).

$$coh_{fg}(\omega_j) \sim \frac{|\hat{f}(\omega_j)||\hat{g}(\omega_j)|\sum_{i=0}^{N-1}\cos(\theta_i(\omega_j) - \eta_i(\omega_j))}{\sqrt{N|\hat{f}(\omega_j)|^2}\sqrt{N|\hat{g}(\omega_j)|^2}} = \qquad (6)$$

$$\frac{1}{N}\sum_i \cos(\theta_i(\omega_j) - \eta_i(\omega_j))$$

Expression (6) means that $Coh_{fg}$ is the correlation index with emphasis on the phase of the signal.

The calculation unit 14 may calculate a correlation index $Coh_{fg}(P,I_{a+b})$ between P(t) and $I_{a+b}(t)$, a correlation index $Coh_{fg}(P,I_{b+c})$ between P(t) and $I_{b+c}(t)$, and a correlation index $Coh_{fg}(P,I_{c+a})$ between P(t) and $I_{c+a}(t)$ by expression (5) described above. Then, the determination unit 16 may determine that the ab phase is the connection phase in a case where $Coh_{fg}(P,I_{a+b})$ is the maximum, determine that the bc phase is the connection phase in a case where $Coh_{fg}(P,I_{b+c})$ is the maximum, and determine that the ca phase is the connection phase in a case where $Coh_{fg}(P,I_{c+a})$ is the maximum.

By the correlation index $Coh_{fg}$ using the phase spectrum in the frequency domain representation as described above, the correct answer rate of the connection phase determination is improved as compared with a case where the correlation coefficient $\rho_T$ in the time domain is used without necessity of a filter optimization process as with the correlation coefficient $\rho_F$ in the frequency domain described above.

Furthermore, in the above-described embodiment, the case where the connection phase is determined by using the index value indicating the correlation between the time-series data of the sum of the line currents and the time-series data of the power consumption of the consumer is described, but there is no limitation. It is also possible to use time-series data of current corresponding to the power consumption in place of the time-series data of the power consumption of the consumer. In this case, the time-series data of the power consumption of the consumer may be converted into the time-series data of the current by following expression (7).

$$I_d^{\prime y}(t) = \frac{\sqrt{2}}{k} \cdot \frac{P_d(t)}{V_d} \qquad (7)$$

$P_d(t)$ represents time-series data of power consumption of a consumer d, $V_d$ represents contract voltage (effective value) of the consumer d, and k represents a transformer transformation ratio. A current value calculated from the time-series data $\rho_d(t)$ of the power consumption of the consumer d measured by the smart meter 116 and the contract voltage (effective value) $V_d$ is the effective value.

Therefore, in expression (7), it is multiplied by square root of 2 for obtaining the amplitude (maximum value).

Furthermore, while a mode in which the transformer connection phase determination program is stored (installed) in advance in the storage unit is described in the above-described embodiment, there is no limitation. The program according to the disclosed technology may also be provided in a form stored in a storage medium such as a CD-ROM, a DVD-ROM, a USB memory and the like.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A non-transitory computer-readable medium storing a transformer connection phase determination program that causes at least one computer to execute a process, the process comprising:
    acquiring a sum of currents that flow through two lines of three lines that supply electric power to a transformer to which a first consuming subject with a single-phase two-wire system and a second consuming subject with a single-phase three-wire system are coupled to, for each of three combinations of two lines of the three lines;
    acquiring an index that indicates a correlation within a certain period between a value related to electric power consumed by the first consuming subject and each of sums of each of the three combinations;
    determining a combination of the three combinations with a maximum index in index of each of the three combinations is a combination of two lines corresponds to the first consuming subject; and
    outputting the determined combination to identify a phase of the transformer for which a repair construction to change a connection of the first consuming subject to resolve an imbalance of the transformer.

2. The non-transitory computer-readable medium according to claim 1, wherein the process further comprises:
    acquiring a correlation coefficient in a time domain between the value related to electric power consumed by the first consuming subject and each of sums of each of the three combinations as the index.

3. The non-transitory computer-readable medium according to claim 1, wherein the process further comprises:
    acquiring a correlation coefficient in a frequency domain between the value related to electric power consumed by the first consuming subject and each of sums of each of the three combinations as the index by using a frequency component of each of the time-series data of the sum of the line currents and the time-series data of the consumed power or the current that corresponds to the power.

4. The non-transitory computer-readable medium according to claim 3, wherein the process further comprises:
    acquiring the index by using a frequency component to which a specific filter is applied.

5. The non-transitory computer-readable medium according to claim 1, wherein the process further comprises:
    acquiring a correlation index between the value related to electric power consumed by the first consuming subject and each of sums of each of the three combinations as the index by using a phase spectrum in frequency domain representation of each of the value related to electric power consumed by the first consuming subject and each of sums of each of the three combinations.

6. The non-transitory computer-readable medium according to claim 1, wherein the process further comprises:
    acquiring a value related to electric power consumed by one virtual consuming subject by adding up the value related to electric power consumed by the first consuming subject and a value related to electric power consumed by a second consuming subject coupled to the transformer.

7. A transformer connection phase determination device comprising:
    one or more memories; and
    one or more processors coupled to the one or more memories and the one or more processors configured to
    acquire a sum of currents that flow through two lines of three lines that supply electric power to a transformer to which a first consuming subject with a single-phase two-wire system and a second consuming subject with a single-phase three-wire system are coupled to, for each of three combinations of two lines of the three lines,
    acquire an index that indicates a correlation within a certain period between a value related to electric power consumed by the first consuming subject and each of sums of each of the three combinations,
    determine a combination of the three combinations with a maximum index in index of each of the three combinations is a combination of two lines corresponds to the first consuming subject, and
    output the determined combination to identify a phase of the transformer for which a repair construction to change a connection of the first consuming subject to resolve an imbalance of the transformer.

8. The transformer connection phase determination device according to claim 7, wherein
    the one or more processors are further configured to acquire a correlation coefficient in a time domain between the value related to electric power consumed by the first consuming subject and each of sums of each of the three combinations as the index.

9. The transformer connection phase determination device according to claim 7, wherein
    the one or more processors are further configured to acquire a correlation coefficient in a frequency domain between the value related to electric power consumed by the first consuming subject and each of sums of each of the three combinations as the index by using a frequency component of the value related to electric power consumed by the first consuming subject and each of sums of each of the three combinations.

10. The transformer connection phase determination device according to claim 9, wherein
    the one or more processors are further configured to acquire the index by using a frequency component to which a specific filter is applied.

11. The transformer connection phase determination device according to claim 7, wherein
    the one or more processors are further configured to acquire a correlation index between the value related to electric power consumed by the first consuming subject and each of sums of each of the three combinations as the index by using a phase spectrum in frequency domain representation of the value related to electric power consumed by the first consuming subject and each of sums of each of the three combinations.

12. The transformer connection phase determination device according to claim 7, wherein
the one or more processors are further configured to acquire a value related to electric power consumed by one virtual consuming subject by adding up the value related to electric power consumed by the first consuming subject and a value related to electric power consumed by a second consuming subject coupled to the transformer.

13. A transformer connection phase determination method for at least one computer to execute a process comprising:
acquiring a sum of currents that flow through two lines of three lines that supply electric power to a transformer to which a first consuming subject with a single-phase two-wire system and a second consuming subject with a single-phase three-wire system are coupled to, for each of three combinations of two lines of the three lines;
acquiring an index that indicates a correlation within a certain period between a value related to electric power consumed by the first consuming subject and each of sums of each of the three combinations;
determining a combination of the three combinations with a maximum index in index of each of the three combinations is a combination of two lines corresponds to the first consuming subject; and
outputting the determined combination to identify a phase of the transformer for which a repair construction to change a connection of the first consuming subject to resolve an imbalance of the transformer.

14. The transformer connection phase determination method according to claim 13, wherein the process further comprises:
acquiring a correlation coefficient in a time domain between the value related to electric power consumed by the first consuming subject and each of sums of each of the three combinations as the index.

15. The transformer connection phase determination method according to claim 13, wherein the process further comprises:
acquiring a correlation coefficient in a frequency domain between the value related to electric power consumed by the first consuming subject and each of sums of each of the three combinations as the index by using a frequency component of the value related to electric power consumed by the first consuming subject and each of sums of each of the three combinations.

16. The transformer connection phase determination method according to claim 15, wherein the process further comprises:
acquiring the index by using a frequency component to which a certain filter is applied.

17. The transformer connection phase determination method according to claim 13, wherein the process further comprises:
acquiring a correlation index between the value related to electric power consumed by the first consuming subject and each of sums of each of the three combinations as the index by using a phase spectrum in frequency domain representation of the value related to electric power consumed by the first consuming subject and each of sums of each of the three combinations.

18. The transformer connection phase determination method according to claim 13, wherein the process further comprises:
acquiring a value related to electric power consumed by one virtual consuming subject by adding up the value related to electric power consumed by the first consuming subject and a value related to electric power consumed by a second consuming subject coupled to the transformer.

* * * * *